United States Patent
Oh et al.

(10) Patent No.: US 8,080,472 B2
(45) Date of Patent: Dec. 20, 2011

(54) METAL LINE HAVING A $Mo_xSi_y$/MO DIFFUSION BARRIER OF SEMICONDUCTOR DEVICE AND METHOD FOR FORMING THE SAME

(75) Inventors: Joon Seok Oh, Gyeonggi-do (KR); Seung Jin Yeom, Gyeonggi-do (KR); Baek Mann Kim, Gyeonggi-do (KR); Dong Ha Jung, Gyeonggi-do (KR); Nam Yeal Lee, Gyeonggi-do (KR); Jae Hong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 3 days.

(21) Appl. No.: 12/472,721

(22) Filed: May 27, 2009

(65) Prior Publication Data

US 2010/0052167 A1   Mar. 4, 2010

(30) Foreign Application Priority Data

Aug. 29, 2008   (KR) ................ 10-2008-0085395

(51) Int. Cl.
*H01L 21/425*  (2006.01)
*H01L 21/4763*  (2006.01)

(52) U.S. Cl. ........ 438/627; 438/524; 438/628; 438/637; 438/643; 438/653; 257/E21.165; 257/E21.294; 257/E21.584

(58) Field of Classification Search ........... 257/E21.165, 257/E21.294, E21.584
See application file for complete search history.

(56) References Cited

U.S. PATENT DOCUMENTS

| | | | | |
|---|---|---|---|---|
| 5,698,113 A * | 12/1997 | Baker et al. | | 216/72 |
| 6,562,713 B1 * | 5/2003 | Belyansky et al. | | 438/631 |
| 7,777,336 B2 * | 8/2010 | Kim et al. | | 257/751 |
| 7,855,456 B2 * | 12/2010 | Kim et al. | | 257/751 |
| 2006/0024953 A1 * | 2/2006 | Papa Rao et al. | | 438/629 |
| 2007/0045854 A1 * | 3/2007 | Lim et al. | | 257/763 |
| 2008/0251928 A1 * | 10/2008 | Chang et al. | | 257/762 |
| 2008/0277790 A1 * | 11/2008 | Lee | | 257/751 |

FOREIGN PATENT DOCUMENTS

| | | |
|---|---|---|
| JP | 08-045878 A | 2/1996 |
| KR | 10-0602087 B1 | 1/2006 |

OTHER PUBLICATIONS

Malikov et al. "Electrical Resistivity of Epitaxial Molybdenum Film Grown by Laser Ablation Deposition", J. Appl. Phys., vol. 82, No. 11, Dec. 1, 1997, American Institute of Physics, pp. 5555-5559.*
Yoichi et al., English Machine Translated of JP Publication No. H08-045878, Feb. 16, 1996; (Machine Translated Oct. 14, 2010).*

* cited by examiner

*Primary Examiner* — Mohsen Ahmadi
(74) *Attorney, Agent, or Firm* — Ladas & Parry LLP

(57) ABSTRACT

A metal line having a $Mo_xSi_y$/Mo diffusion barrier of a semiconductor device and corresponding methods of fabricating the same are presented. The metal line includes an insulation layer, a diffusion barrier, and a metal layer. The insulation layer is formed on a semiconductor substrate and has a metal line forming region. The diffusion barrier is formed on a surface of the metal line forming region of the insulation layer and has a stack structure composed of a $Mo_xSi_y$ layer and a Mo layer. The metal layer is formed on the diffusion barrier which fills in the metal line forming region of the insulation layer.

15 Claims, 4 Drawing Sheets

METAL LINE HAVING A MO$_x$SI$_y$/MO DIFFUSION BARRIER OF SEMICONDUCTOR DEVICE AND METHOD FOR FORMING THE SAME

CROSS-REFERENCE TO RELATED APPLICATIONS

The present application claims priority to Korean patent application number 10-2008-0085395 filed on Aug. 29, 2008, which is incorporated herein by reference in its entirety.

BACKGROUND OF THE INVENTION

The present invention relates to metal lines semiconductor devices and to methods for forming the same, and more particularly, to a metal line having of a Mo$_x$Si$_y$/Mo stacked diffusion barrier that inhibits copper diffusion.

Generally, metal lines are in a semiconductor device to electrically connect together various elements or lines with each other. Contact plugs are formed to electrically connect together lower metal lines and upper metal lines to each other. As the high integration of semiconductor devices continues to proceed, the aspect ratios of contact holes in which contact plugs are formed also gradually increases. As a result, the process for forming metal lines and contact plugs become more difficult because these diminutive metal lines and contact plugs must also maintain their physical and performance characteristics such as assuring that unwanted impurities do not diffuse past their respective corresponding diffusion barriers.

Aluminum and tungsten have been mainly used as suitable conductive materials in the metal lines of a semiconductor devices because they exhibit relatively good electrical conductivity properties and because they do not tend towards adversely affecting the performance of the resultant semiconductor device due to unwanted diffusion away from these metal lines. Recently, research has been made in the hopes of using copper as a next-generation material for a metal line because copper exhibits a superior electrical conductivity and a corresponding low resistance as compared to aluminum and tungsten. Copper (Cu) can therefore solve or at least aid in minimizing the problems associated with RC (resistance-capacitance) signal delay in the semiconductor device having a high level of integration and high operating speed.

It is known that copper diffuses rapidly through semiconductor substrates as well as through insulation layers. Further, the diffused copper is known to act as a deep-level impurity in the semiconductor substrate made of silicon and can induce leakage currents. Therefore, it is necessary to form a diffusion barrier at an interface between a copper layer acting as a metal line and the surrounding insulation layer.

Hereinbelow, a conventional method for forming a metal line of a semiconductor device will be briefly described.

After forming an insulation layer on a semiconductor substrate, a metal line forming region is defined by etching the insulation layer. Then, a diffusion barrier is formed on the insulation layer and on the surface of the metal line forming region, and a copper seed layer is subsequently formed on the diffusion barrier. Next, after forming a copper layer on the copper seed layer, a metal line comprising the copper layer is formed by CMPing (chemically and mechanically polishing) the copper layer.

However, in the conventional art described above, as the size of cells decreases in conformity with the trend toward higher integration of these semiconductor devices, the thickness of the diffusion barrier should also decrease. Therefore, it is becoming more difficult to properly prevent the diffusion of a copper constituent by means of the diffusion barrier formed in accordance to the conventional art techniques. Furthermore, in the conventional art described above, it is becoming more and more difficult to increase the thickness of the diffusion barrier so as to improve the characteristics of the diffusion barrier and thereby as a result the characteristics of the subsequent diffusion barrier deteriorate. In addition, in the conventional art described above, an unwanted overhang phenomenon can occur due to the conglomeration of the copper seed layer formed on the diffusion barrier. Because of this conglomeration of copper, the entrance to the metal line forming region is prone to being clogged, and as a consequence unwanted voids can be created in the metal line and thus the characteristics of the metal line can deteriorate.

As a result of fabricating metals lines using the conventional arts as described above, the characteristics and the reliability of a semiconductor device become compromised.

BRIEF SUMMARY OF THE INVENTION

Embodiments of the present invention are directed to a metal line of a semiconductor device that can result in improving the characteristics of a diffusion barrier and a method for forming the same.

Also, embodiments of the present invention are directed to a metal line of a semiconductor device that can exhibit improved characteristics and enhanced reliability of a resultant semiconductor device and a method for forming the same.

In one aspect of the present invention, a metal line of a semiconductor device comprises an insulation layer formed on a semiconductor substrate and having a metal line forming region; a diffusion barrier formed on a surface of the metal line forming region of the insulation layer and having a stack structure of an Mo$_x$Si$_y$ layer and an Mo layer; and a metal layer formed on the diffusion barrier to fill the metal line forming region of the insulation layer.

In the Mo$_x$Si$_y$ layer, the x subscript is a real number that has a preferable range of about 1~10, and the y subscript is a real number that has a preferable range of about 1~10.

The Mo$_x$Si$_y$ layer has a preferable thickness of about 5~100 Å.

The Mo layer has a preferable thickness of about 5~400 Å.

The metal layer may be any conductive material such as polysilicon, aluminum, tungsten in which it is preferable that the metal layer comprises a copper.

In another aspect of the present invention, a method for forming a metal line of a semiconductor device comprises the steps of forming an insulation layer on a semiconductor substrate to have a metal line forming region; forming a diffusion barrier on the insulation layer including a surface of the metal line forming region to have a stack structure of an Mo$_x$Si$_y$ layer and an Mo layer; and forming a metal layer on the diffusion barrier to substantially fill in the metal line forming region.

The step of forming the diffusion barrier comprises the steps of forming a first Mo layer on the insulation layer including a surface of the metal line forming region; silicidating the first Mo layer and thereby converting the first Mo layer into an Mo$_x$Si$_y$ layer; and forming a second Mo layer on the Mo$_x$Si$_y$ layer.

Silicidation of the first Mo layer is implemented for about 1~30 minutes.

The silicidation of the first Mo layer is implemented under a pressure of about 1~760 mtorr.

The silicidation of the first Mo layer is implemented at a temperature of about 25~400° C.

The step of silicidating the first Mo layer comprises the steps of plasma-processing the first Mo layer; and soaking the plasma-processed first Mo layer in an SiH$_4$ atmosphere.

The step of forming the first Mo layer and the step of silicidating the first Mo layer and thereby converting the first Mo layer into the Mo$_x$Si$_y$ layer can be repeatedly implemented about 1~50 times.

The step of forming the second Mo layer can be implemented at a temperature of about −25~100° C.

In the Mo$_x$Si$_y$ layer, x is a real number that has a range of about 1~10, and y is a real number that has a range of about 1~10.

The Mo$_x$Si$_y$ layer is formed to have a thickness of about 5~100 Å.

The Mo layer is formed to have a thickness of about 5~400 Å.

The metal layer preferable comprises a copper layer.

DESCRIPTION OF SPECIFIC EMBODIMENTS

In the present invention, when forming a metal line using a copper layer, a diffusion barrier having the stack structure composed of a Mo$_x$Si$_y$ layer and a Mo layer formed between an insulation layer and a copper layer. By doing this, since the Mo constituent exhibits little or no solid-solved copper, the characteristics of the diffusion barrier having the stack structure of the Mo$_x$Si$_y$ layer and the Mo layer are substantially improved. Also, since the Mo constituent exhibits excellent electrical conductivity due its very low resistance of 2.4 μΩ/cm, then the diffusion barrier not only prevents the diffusion of the copper constituent but it also can serve as a seed layer for the copper layer.

Therefore, in the present invention, because it is not necessary to form a separate seed layer onto the diffusion barrier, then the unwanted overhang phenomenon of the copper layer can be reduced or avoided, and thus the creation of unwanted voids in the copper layer can be minimized. By doing this, in the present invention, the characteristics of the metal line can be improved in comparison with the conventional art, whereby the characteristics and the reliability of a semiconductor device can be improved.

Hereafter, specific embodiments of the present invention will be described in detail with reference to the attached drawings. The drawings are not necessarily to scale and in some instances proportions may have been exaggerated in order to more clearly depict certain features of the invention.

Figure 1:
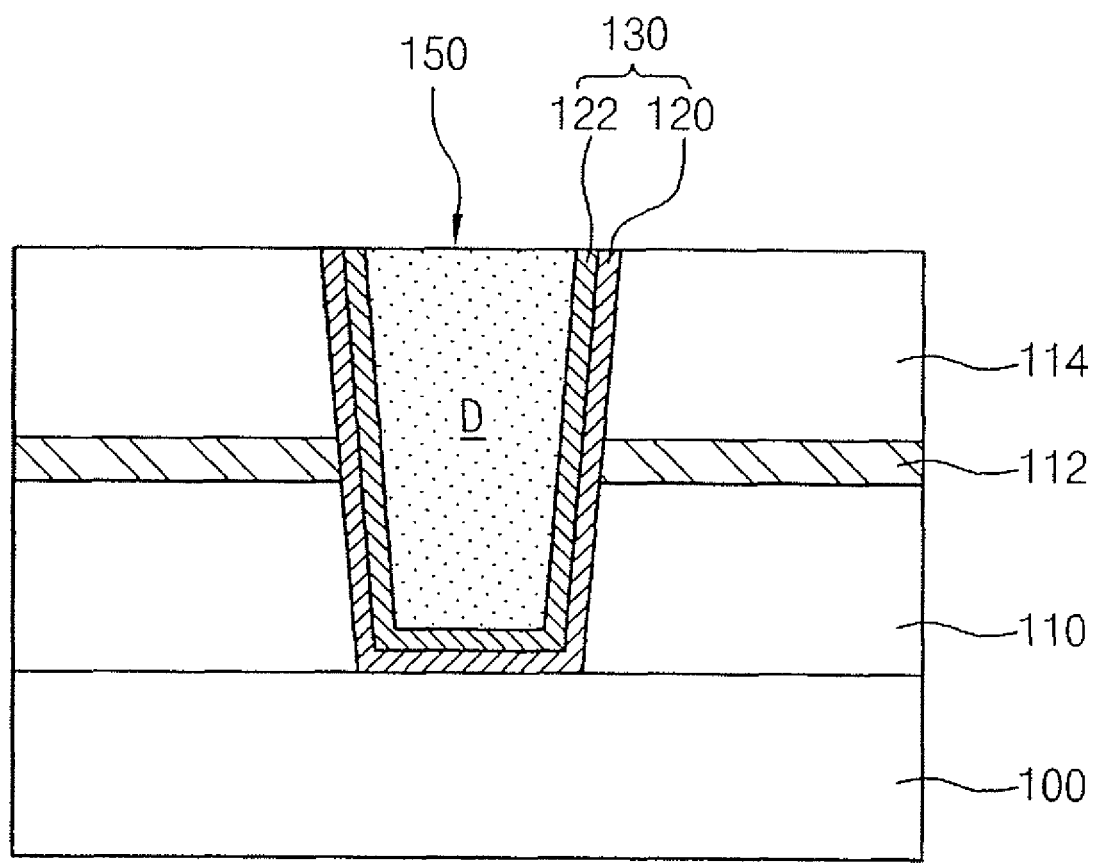
FIG. 1 is a sectional view illustrating a metal line of a semiconductor device in accordance with an embodiment of the present invention.

FIG. 1 is a sectional view illustrating a metal line of a semiconductor device in accordance with an embodiment of the present invention.

Referring to FIG. 1, a first insulation layer 110, an etch stop layer 112 and a second insulation layer 114 are formed on a semiconductor substrate 100 which is formed with a predetermined understructure (not shown), in such a way as to have a metal line forming region D. The metal line forming region D can be defined by using any known now methodology such as using a single damascene process or a dual damascene process. The metal forming region D may have any shape or structure such as having a trench structure or a trench and via-hole structure which has a trench and at least one via-hole communicating with the trench. The first and second insulation layers 110 and 114 may comprise any known type of insulation layers, such as, silicon oxide layers. The etch stop layer 112 may comprise any known etch stop layers, for example, a silicon nitride layer.

A diffusion barrier 130 having the stack structure of an Mo$_x$Si$_y$ layer 120 and an Mo layer 122 is formed on the surface of the metal line forming region D. The stoichiometry of the Mo$_x$Si$_y$ layer 120 may be any known stochiometric ratio. Preferably the x subscript of the Mo$_x$Si$_y$ layer 120 is a real number that has a range of about 1~10, and the y subscript is a real number that has a range of about 1~10. The Mo$_x$Si$_y$ layer 120 may have any thickness in which it is preferred that Mo$_x$Si$_y$ layer 120 has a thickness of about 5~100 Å. Likewise the Mo layer 122 may be any thickness in which it is preferred that the Mo layer 122 has a thickness of about 5~400 Å.

A metal line 150 is then formed on the diffusion barrier 130 to substantially fill in the metal line forming region D. The metal line 150 may be composed of any electrically conductive material in which it is preferred that the metal line 150 comprises a copper layer.

Because the diffusion barrier 130 has the stack structure of the Mo$_x$Si$_y$ layer 120 and the Mo layer 122, each layer has a Mo constituent which exhibits little or no solid-solved properties for copper. As a result, the characteristics of the resulting diffusion barrier 130 are substantially improved as compared to the conventional art. Accordingly, since the diffusion barrier 130 of the present application can prevent or at least significantly inhibit the diffusion of a copper constituent then a relatively thinner thickness of the diffusion barrier 130 is needed in the present invention. As a result, the characteristics of the diffusion barrier 130 can be effectively improved even without increasing the thickness thereof. Thereby the characteristics and the reliability of a semiconductor device can be improved.

Moreover, because the molybdenum constituent of the diffusion barrier 130 in the present invention also exhibits excellent electrical conductivity, then the copper layer can be easily deposited even without the need for forming an additional seed layer on the diffusion barrier 130. Thus, in the present invention, the overhang phenomenon brought about by the unwanted conglomeration of the seed layer can be reduced or avoided. Thus creation of unwanted voids in the copper layer can be at least minimized and possibly avoided which in turn result in enhancing the performance characteristics of the resultant metal line of the present invention.

FIGS. 2A through 2F are sectional views that illustrate some of the more important processes of a method for forming a metal line of a semiconductor device in accordance with another embodiment of the present invention.

Figure 2A:
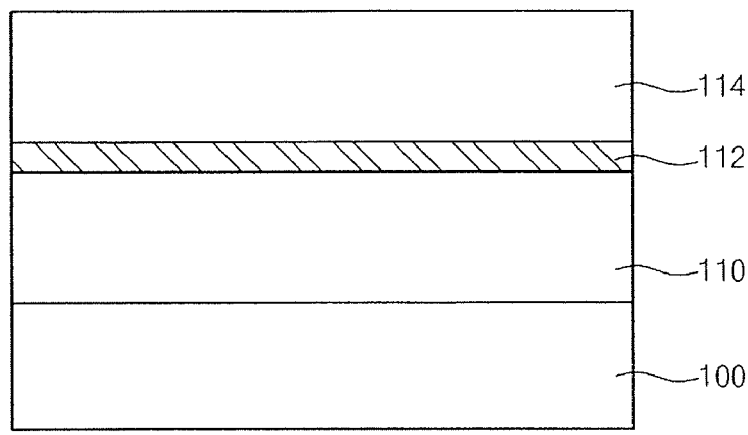
FIGS. 2A through 2F are sectional views illustrating the processes of a method for forming a metal line of a semiconductor device in accordance with another embodiment of the present invention.

Referring now to FIG. 2A, a first insulation layer 110, an etch stop layer 112 and a second insulation layer 114 are sequentially formed on a semiconductor substrate 100 which is formed with a predetermined understructure (not shown), such that the understructure is covered. For example, the first and second insulation layers 110 and 114 may comprise silicon oxide layers, and the etch stop layer 112 may comprise a silicon nitride layer.

Figure 2B:
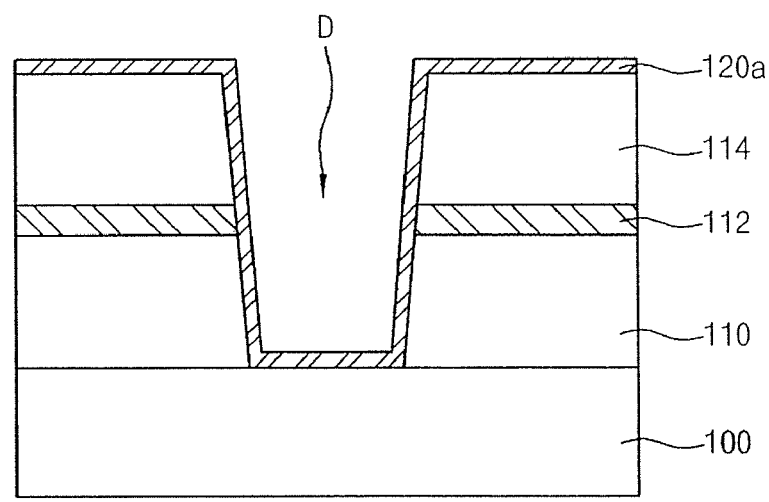

Referring now to FIG. 2B, by etching the second insulation layer 114, the etch stop layer 112 and the first insulation layer 110, a metal line forming region D is defined. The metal line forming region D may be defined for a single damascene process or a dual damascene process to fill in the metal line forming region D. The metal line forming region D may have a trench structure or a trench and via-hole structure which has a trench and at least one via-hole communicating with the trench. A first Mo layer 120a is formed on the second insulation layer 114 and on the surface of the metal line forming region D. The first Mo layer 120a may be formed by any known methodology of depositing a molybdenum layer, such as using chemical vapor deposition (CVD), metal-organic CVD (MOCVD), plasma enhanced CVD (PECVD), evaporation, or physical vapor deposition (PVD) techniques.

Figure 2C:
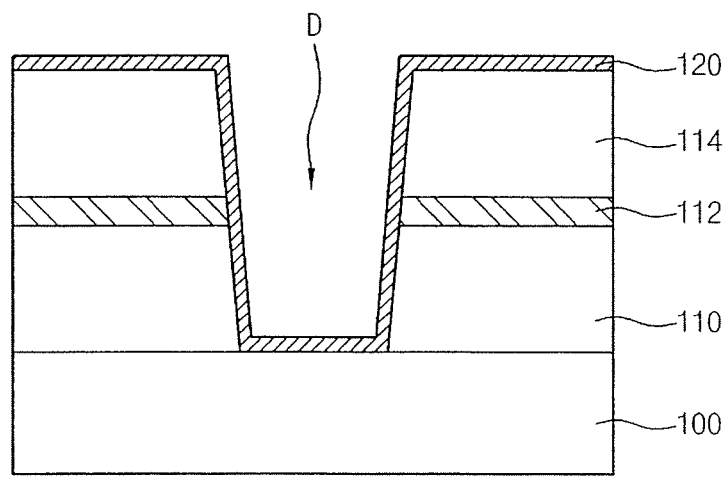

Referring now to FIG. 2C, the first Mo layer 120a is then silicidating which converts the first Mo layer 120a into an $Mo_xSi_y$ layer 120. The silication of the first Mo layer 120a is implemented preferable at a temperature below about 400° C., for example, about 25~400° C. under a pressure of about 1~760 mTorr within 30 minutes, preferably, for about 1~30 minutes. In detail, the silicidation of the first Mo layer 120a is performed in a manner such that the first Mo layer 120a is first plasma-processed to elevate the reactivity of the surface thereof and then, chemical soaking is executed. Here, the chemical soaking is executed, for example, by preferably exposing the plasma-processed first Mo layer 120a to a $SiH_4$ atmosphere.

Meanwhile, although not shown in a drawing, the process for forming the first Mo layer 120a and the process for silicidating the first Mo layer 120a can be repeatedly conducted about 1~50 times until the resultant $Mo_xSi_y$ layer 120 has a desired thickness, preferably, about 5~100 Å.

Figure 2D:
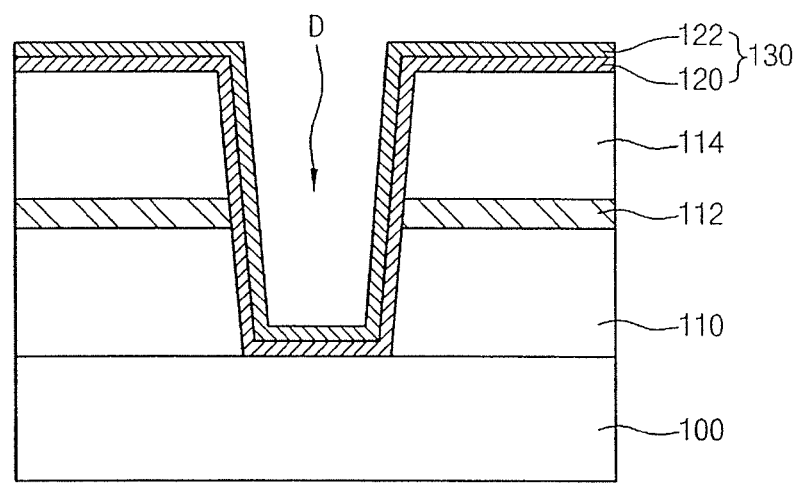

Referring now to FIG. 2D, a second Mo layer 122 is then subsequently formed on the $Mo_xSi_y$ layer 120. The second Mo layer 122 is also formed by any known deposition technique such as using CVD, MOCVD, PECVD, evaporation or PVD, preferably, at a temperature of about −25~100° C. The second Mo layer 122 can be formed at any thickness, however it is preferred that the second Mo layer 122 is also formed at a thickness of about 5~400 Å. As a result, a diffusion barrier 130 having the stack-like structure of the second Mo layer 122 stacked on top of the $Mo_xSi_y$ layer 120. As a result, a diffusion barrier 130 is formed on the second insulation layer 114 and on the surface of the metal line forming region D.

Figure 2E:
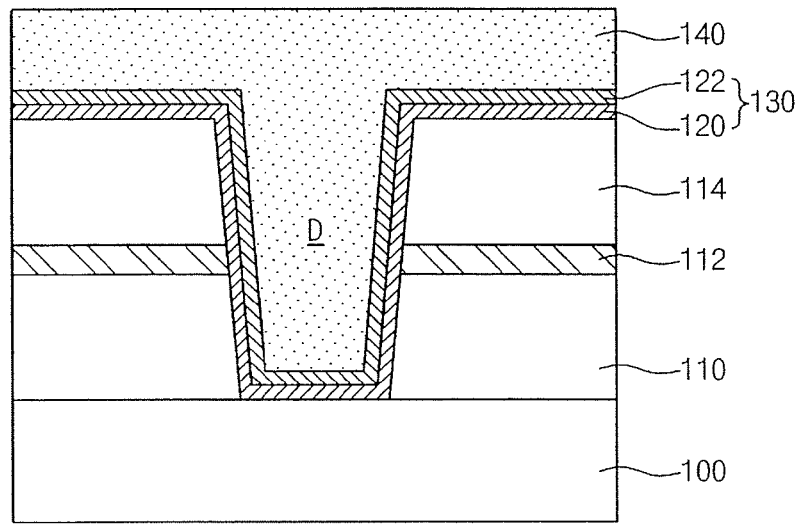

Referring now to FIG. 2E, a metal layer 140 is formed on the diffusion barrier 130 to fill the metal line forming region D. The metal layer 140 may comprise any conductive metal in which it is preferred that the metal layer 140 comprises a copper layer. The copper layer is preferably formed using electroplating. Since the diffusion barrier 130 has a molybdenum constituent that has an excellent electrical conductivity property, then the metal layer 140 can be formed without the need for additionally forming a seed layer on the diffusion barrier 130.

Figure 2F:
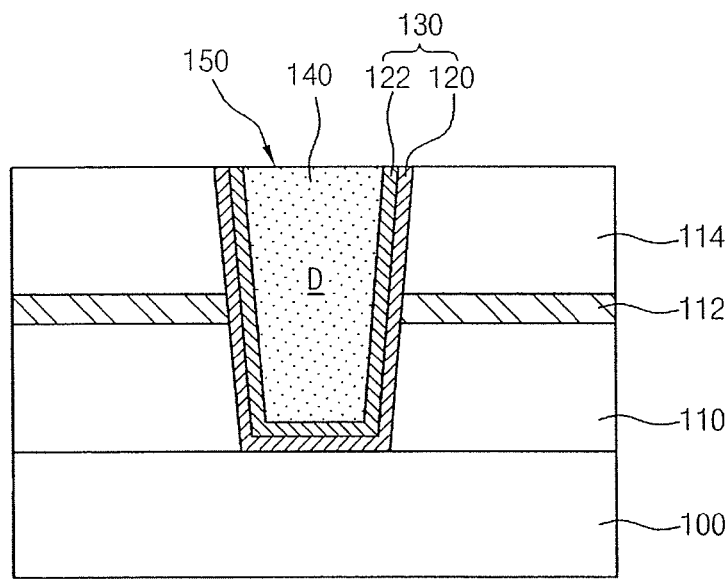

Referring now to FIG. 2F, by CMPing the metal layer 140 and the diffusion barrier 130 until the second insulation layer 114 is exposed, a metal line 150 which subsequently fills the metal line forming region D is formed.

Thereafter, while not shown in a drawing, by sequentially conducting a series of other well-known subsequent processes, the formation of the resultant metal line of a semiconductor device according to the embodiment of the present invention is completed.

As is apparent from the above description, in the present invention, when forming a metal line using a copper layer, a stacked diffusion barrier having a $Mo_xSi_y$ layer stacked underneath a Mo layer is formed. Since the molybdenum constituent of the diffusion barrier exhibits little or no solid-solved copper, i.e., little or no copper penetration, then excellent characteristics for the diffusion barrier can be realized in preventing the diffusion of a copper constituent. Hence, the characteristics of the diffusion barrier having the stack structure of the $Mo_xSi_y$ layer and the Mo layer exhibit an improved performance relative to diffusion barriers made from the more conventional arts. Furthermore, in the present invention, the diffusion of the copper layer can still be effectively prevented even with a thinner thickness as compared to those diffusion barriers made from the more conventional arts.

Moreover, in the present invention the molybdenum constituent not only exhibits excellent properties relative to the diffusion barrier characteristics but also exhibits excellent electrical conductivity properties. Accordingly, it is not necessary to form an additional seed layer on the diffusion barrier. As a result the present invention can realize a thinner thickness of the diffusion barrier by up to half that of more conventional arts. Thereby the present invention can aid in realizing a higher integrated level in the semiconductor device.

Further, in the present invention, an overhang phenomenon, which can occur from unwanted conglomeration of a seed layer, can be reduced or avoided. As a result, voids in the resultant copper layer can be avoided or minimized because the present invention is less prone to clogging the entrance to a metal line forming region. Thereby the characteristics of the metal line can be improved.

Although specific embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A metal line of a semiconductor device, comprising:
   an insulation stack layer on a semiconductor substrate that defines a metal line forming region which exposes a portion of the semiconductor substrate, wherein the insulation stack layer comprises:
      a first insulation layer formed directly on the semiconductor substrate;
      an etch stop layer formed directly on the first insulation layer; and
      a second insulation layer formed directly on the etch stop layer;
   a diffusion barrier on the metal line forming region of the insulation stack layer, the diffusion barrier having a stack structure including an $Mo_xSi_y$ layer directly formed so as to cover a bottom of the metal line forming region and directly formed on sidewalls of the metal line forming region of the insulation stack layer and an Mo layer entirely stacked on the $Mo_xSi_y$ layer such that the Mo layer is directly formed on the $Mo_xSi_y$ layer in the bottom of the metal line forming region and directly formed on the sidewalls of the $Mo_xSi_y$ layer in the metal line forming region; and
   a metal layer on the Mo layer of the diffusion barrier filling in the metal line forming region of the insulation stack layer without a seed layer interposed between the metal layer and the metal line forming region.

2. The metal line according to claim 1, wherein the x subscript of the $Mo_xSi_y$ layer is a real number about 1~10, and the y subscript of the $Mo_xSi_y$ is a real number about 1~10.

3. The metal line according to claim 1, wherein the $Mo_xSi_y$ layer has a thickness of about 5~100 Å.

4. The metal line according to claim 1, wherein the Mo layer has a thickness of about 5~400 Å.

5. The metal line according to claim 1, wherein the metal layer comprises a copper layer.

6. A method for forming a metal line of a semiconductor device, comprising the steps of:

forming an insulation stack layer on a semiconductor substrate to have a metal line forming region, wherein the insulation stack layer comprises:
  a first insulation layer formed directly on the semiconductor substrate;
  an etch stop layer formed directly on the first insulation layer; and
  a second insulation layer formed directly on the etch stop layer;
forming a diffusion barrier on the insulation stack layer and on a surface of the metal line forming region, the diffusion barrier comprises a stack structure including an $Mo_xSi_y$ layer directly formed so as to cover a bottom of the metal line forming region of the insulation stack layer and an Mo layer entirely stacked on the $Mo_xSi_y$ layer such that the Mo layer is directly formed on the $Mo_xSi_y$ layer in the bottom of the metal line forming region and directly formed on the sidewalls of the $Mo_xSi_y$ layer in the metal line forming region, wherein the step of forming the diffusion barrier comprises the steps of:
  forming a first Mo layer on the insulation stack layer and on the surface of the metal line forming region;
  silicidating the first Mo layer to convert the first Mo layer into the $Mo_xSi_y$ layer, wherein the step of silicidating the first Mo layer comprises the steps of:
    plasma-processing the first Mo layer; and
    soaking the plasma-processed first Mo layer in an $SiH_4$ atmosphere; and
  forming a second Mo layer on the $Mo_xSi_y$ layer; and
forming a metal layer directly on the second Mo layer of the diffusion barrier to substantially fill in the metal line forming region without a seed layer interposed between the metal layer and the metal line forming region.

7. The method according to claim 6 wherein silicidation of the first Mo layer is implemented for about 1~30 minutes.

8. The method according to claim 6 wherein the silicidation of the first Mo layer is implemented under a pressure of about 1~760 mTorr.

9. The method according to claim 6 wherein the silicidation of the first Mo layer is implemented at a temperature of about 25~400° C.

10. The method according to claim 6 wherein the step of forming the first Mo layer and the step of silicidating the first Mo layer of converting the first Mo layer into the $Mo_xSi_y$ layer are repeated about 1~50 times.

11. The method according to claim 6 wherein the step of forming the second Mo layer is implemented at a temperature of about −25~100° C.

12. The method according to claim 6, wherein the x subscript of the $Mo_xSi_y$ layer is a real number that has a range of about 1~10, and the y subscript of the $Mo_xSi_y$ layer is a real number that has a range of about 1~10.

13. The method according to claim 6, wherein the $Mo_xSi_y$ layer is formed to have a thickness of about 5~100 Å.

14. The method according to claim 6, wherein the Mo layer is formed at a thickness of about 5~400 Å.

15. The method according to claim 6, wherein the metal layer comprises a copper layer.

* * * * *